United States Patent [19]

Cava et al.

[11] Patent Number: 4,880,771
[45] Date of Patent: Nov. 14, 1989

[54] BISMUTH-LEAD-STRONTIUM-CALCIUM-CUPRATE SUPERCONDUCTORS

[75] Inventors: Robert J. Cava, Bridgewater; Steven A. Sunshine, Berkeley Heights, both of N.J.

[73] Assignee: American Telephone and Telegraph Company, AT&T Bell Laboratories, Murray Hill, N.J.

[21] Appl. No.: 160,799

[22] Filed: Feb. 26, 1988

Related U.S. Application Data

[63] Continuation-in-part of Ser. No. 155,330, Feb. 12, 1988.

[51] Int. Cl.[4] .................. C01F 11/02; C01G 21/02; C01G 29/00; H01L 39/12
[52] U.S. Cl. .......................................... 505/1; 252/518; 252/521; 423/604; 423/617; 423/618; 423/619; 423/635; 501/94; 501/123; 501/126; 505/809; 505/810
[58] Field of Search .............. 252/518, 521; 423/592, 423/604, 617, 618, 635, 619; 501/123, 126; 505/1, 809, 810

[56] References Cited

U.S. PATENT DOCUMENTS 3,932,315  1/1976  Sleight .............................. 252/521

OTHER PUBLICATIONS

Dupont Corporate News, press release dated Feb. 9, 1988, Wilmington, Del., 2 pp.
Adachi, Seiji et al.: *Jpn. J. Appl. Phys.*, 27 (3), Mar. 1988, pp. L344–L346.
Akimitsu, J. et al.: *Jpn. J. Appl. Phys.*, 26 (12), Dec. 1987, pp. L2080–L2081.
Bando, Y. et al.: *Jpn. J. Appl. Phys.*, 27 (3), Mar. 1988, pp. L358–L360.
Chu, C. W. et al.: *Phys. Rev. Lett.*, 60, (10), Mar. 7, 1988, pp. 941–943.
Hazen, R. M. et al.: *Phy. Rev. Lett.*, 60, (12), Mar. 21, 1988, pp. 1174–1177.
Kijima, T. et al.: *Jpn. J. Appl. Phys.*, 27 (3), Mar. 1988, pp. L369–L371.
Maeda, H. et al.: *Jpn. J. Appl. Phys.*, 27 (2), Feb. 1988, pp. L209–L210.
Matsui, Y. et al.: *Jpn. J. App. Phys.*, 27 (3), Mar. 1988, pp. L372–L375.
Matsui, Y. et al.: *Jpn. J. Appl. Phys.*, 27 (3), Mar. 1988, pp. L361–L364.
Nakao, M. et al.: *Jpn. J. Appl. Phys.*, 27 (3), Mar. 1988, pp. L378–L380.
Oesterreicher, H. et al.: *Materials Letters*, 6, (8.9), May 1988, pp. 254–256.
Takayama-Muromachi, E. et al.: *Jpn. J. Appl. Phys.*, 27 (3), Mar. 1988, pp. L365–L368.
Togano, K. et al.: *Jpn. J. Appl. Phys.*, 27 (3), Mar. 1988, pp. L323–L324.
Torrance, J. B. et al.: *Solid State Comm.*, 66, (7), 1988, pp. 703–706.
Zandbergen, H. W. et al.: *Solid State Comm.*, 66, (4), 1988, pp. 397–403.
Subramanian, M. A. et al.: *Science*, vol. 239, Feb. 26, 1988, pp. 1015–1017.
Dagani, R., *Chem. & Eng. News*, vol. 66, Feb. 1, 1988, p. 5.
*Physical Review Letters*, vol. 58, No. 16, Apr. 20, 1987, "Bulk Superconductivity at 91K in Single-Phase Oxygen-Deficient Perovskite $Ba_2YCu_3O_{9-\delta}$" by R. J. Cava et al., pp. 1676–1679.
*Physical Review Letters*, vol. 58, No. 18, May 4, 1987, "New Superconducting Cuprate Perovskites" by D. W. Murphy et al., pp. 1888–1890.

(List continued on next page.)

*Primary Examiner*—Dennis Albrecht
*Attorney, Agent, or Firm*—Eugen E. Pacher

[57] ABSTRACT

Novel superconductive Pb-substituted oxides are disclosed. The oxides all have layered perovskite-like crystal structure, and manifest superconductivity (R=o) above about 77K. The materials are described by the nominal formula $X_{2+x}M_{3-x}Cu_2O_{8\pm\delta}$, where X is Bi and Pb, M is Sr and Ca, $0 \leq X \leq 0.3$, $0 \leq \delta \leq 0.5$, the Pb/Bi ratio is between about 0.2 and about 0.5, and the Sr/Ca ratio is between 0.5 and 2.

2 Claims, 6 Drawing Sheets

OTHER PUBLICATIONS

*Zeitschr. f. Physik B–Condensed Matter,* vol. 64, 189 (1986), "Possible High $T_c$ Superconductivity in the Ba–La–Cu–O System", by J. G. Bednorz, pp. 189–193.

*Physical Review Letters,* vol. 58, No. 9, Mar. 2, 1987, "Superconductivity at 93K in a New Mixed-Phase Y–Ba–Cu–O Compound System at Ambient Pressure", by M. K. Wu et al., pp. 908–910.

*Physical Review Letters,* vol. 58, No. 9, Mar. 2, 1987, "High-Pressure Study of the New Y–Ba–Cu–O Superconducting Compound System", by P. H. Hor et al., pp. 911–912.

*Superconductor Materials Science, Metallurgy, Fabrication, and Applications,* Plenum Press 1981, S. Foner and B. Schwartz, editors.

*Journal Applied Physics,* 49(1), Jan. 1978, "Picosecond Pulse on Superconducting Striplines", by R. L. Kautz, pp. 308–314.

BISMUTH-LEAD-STRONTIUM-CALCIUM-CUPRATE SUPERCONDUCTORS

This application is a continuation-in-part of U.S. patent application Ser. No. 155,330, filed Feb. 12, 1988 for B. Batlogg, R. J. Cava, S. A. Sunshine and R. B. van Dover, "Devices and Systems Based on Novel Superconducting Material".

FIELD OF THE INVENTION

This invention pertains to oxide superconductors.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., $Nb_3Ge$, probably the material with the highest transition temperature $T_c$ known prior to 1986).

Recently, superconductivity was discovered in a new class of materials, namely, metal oxides. See, for instance, J. G. Bednorz and K. A. Muller, *Zeitschr. f. Physik B—Condensed Matter*, Vol. 64, 189 (1986), which reports superconductivity in lanthanum barium copper oxide.

The above report stimulated worldwide research activity, which very quickly resulted in further significant progress. The progress has resulted, inter alia, to date in the discovery that compositions in the Y-Ba-Cu-O system can have superconductive transition temperatures $T_c$ above 77 K., the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ above 90 K. (see, for instance, R. J. Cava et al, *Physical Review Letters*, Vol. 58(16), pp. 1676–1679), and D. W. Murphy et al, *Physical Review Letters*, Vol. 58(18), pp. 1888–1890.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be one of the most advantageous cryogenic refrigerants, and attainment of superconductivity at liquid nitrogen temperature was a long-sought goal which until very recently appeared almost unreachable.

A huge volume of work on high temperature superconductors has been reported since publication of the above seminal papers. Most of the work deals with $YBa_2Cu_3O_x$ (the so-called 1-2-3 compound) and related compounds. In all of these compounds the superconducting phase is perovskite-like, typically having orthorhombic crystal structure, and the compounds that exhibit high (ie., $T_c \geq 77$ K.) temperature superconductivity generally contain one or more rare earth elements.

The discovery of high $T_c$ superconductivity in some mixed copper oxides also stimulated a search for compounds exhibiting still higher $T_c$. Despite numerous reports of observation of $T_c$ above 100 K. (even above room temperature) in 1-2-3 and related compounds, up until recently no stable superconductors with $T_c$ higher that $YBa_2Cu_3O_7$ have been reported. Thus wire service and newspaper reports that groups in the USA and in Japan have discovered stable high $T_c$ superconductivity in samples containing Bi, Al, Sr, Ca, Cu, and oxygen, and Bi, Sr, Ca, Cu, and oxygen, respectively, were received with considerable interest. See, for instance, *New York Times*, Jan. 26, 1988.

It soon became apparent that the Bi-Sr-Ca-Cu oxide samples were multiphase material and frequently contained three superconducting phases, having $T_c$ near 120, 105, and 80 K. respectively. Although the existence of these phases was recognized, their compositions and structures remained unknown.

The importance of having available a superconductor with still higher $T_c$ than the 1-2-3 compound is probably evident to everyone skilled in the art. Furthermore, the newly discovered materials contain only relatively common and inexpensive elements. Thus there is strong economic interest in the development of these materials. Finally, the prior art high $T_c$ superconductors have properties that are obstacles to their technological use. For instance, the prior art materials are relatively brittle, both in single crystal form and in the form of sintered bodies.

For general overview of some potential applications of superconductors see, for instance, B. B. Schwartz and S. Foner, editors, *Superconductor Applications: SQUIDS and MACHINES*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets for e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials. In particular, it is expected that superconductors according to the invention can advantageously be used in these and/or other applications, in a manner similar to that proposed for the prior art high $T_c$ superconductors.

SUMMARY OF THE INVENTION

AN important aspect of the invention takes the form of identification of the composition and structure of the compounds that are responsible for the observed high $T_c$ superconductivity in the previously referred to novel materials. Another aspect of the invention resides in the discovery of principles that suggest related compounds that are currently expected to have advantageous properties, including high $T_c$. At least some of the inventive compounds are relatively ductile. This unexpected property of these inventive compounds is believed to have significant advantageous implications for the technological utilization of the new materials.

We have identified the structure and composition of the phase that shows bulk superconductivity at about 84 K. The composition of an exemplary crystal is $Bi_{2.2}Sr_2Ca_{0.8}Cu_2O_{8\pm\delta}$, where $\delta$ is a small number, typically between 0–0.5. The structure of the exemplary crystal can be resolved in terms of an orthorhombic subcell of dimension $5.414 \times 5.418 \times 30.89$ Å. A prominent feature of the structure are Bi-O double layers (parallel to the basal plane), with CuO$_2$-planes located between the Bi-O planes. An unusual feature of the structure of the exemplary crystal is the existence of an incommensurate superlattice ($\sim 4.76 \times$b). We have discovered that the superlattice spacing can be affected by composition and/or processing conditions. This observation is considered to be significant, and the superlattice is likely to be intimately related to the superconductivity of the sample.

In greater generality the inventive material is nominally of perovskite structure and the nominal composition X$_{2.2}$M$_{2.8}$Cu$_2$O$_{8\pm\delta}$, where X is Bi or Bi and Pb, M is a divalent ion, mixture of divalent ions, or combination of monovalent and trivalent ions such that the average valence of M is substantially equal to 2, and $\delta$ is a small number, typically $0 \leq \delta \leq 0.5$. An important constraint on allowable compositions, especially on M, is the requirement that the inventive material manifest high T$_c$ superconductivity, typically T$_c > 77$ K. In preferred embodiments M is Ca, Sr, Ba, Mg, Cd, Na, K, Y, or mixtures thereof.

We have also discovered that partial substitution of Bi by Pb can have advantageous results, especially in terms of increased T$_c$. Compositions having nominal formula X$_{2+x}$M$_{3-x}$Cu$_2$O$_{8\pm\delta}$ have been found to have particularly advantageous properties, including a strong Meissner effect at relatively high temperatures, and a relatively high T$_c$(R=o). In the above nominal formula x is Bi and Pb, M is Sr and Ca, and $0 \leq x \leq 0.3$. In some currently preferred embodiments x is about zero, the Pb/Bi ratio is greater than 0.2, but less than about 0.5, and the Sr/Cu ratio is typically between about 0.5 and 2, with 1$\pm$0.25 being currently preferred. Substantial lead substitution for Bi thus appears to lead to improved high T$_c$ superconductive material, and this discovery is considered to be potentially of considerable significance. The above limits have been found to be valid under processing conditions as described in Example 5, but it is considered possible that compositions outside these limits may also have some utility. For instance, we have found indications of high T$_c$ superconductivity in a sample produced from Bi-free powder that contained Pb, Y, Sr and Cu.

Based on the results of out investigations we conclude that there exist phases of the Bi-SR-Ca-Cu oxide system that are likely to have advantageous properties. In particular, we believe that all (or at least some) of these phases are likely to be stable high T$_c$ superconductors, with T$_c$s likely to be above 100 K.

The novel phases all have a crystal structure that is closely related to that of the above described 80 K. compound and thus are perovskite-like. They differ from each other essentially only in the number of crystal planes between the two Bi-O double planes that bound the unit cell in the c-direction, or by the size of the supercell. The composition of the novel phases can be expressed by means of the nominal formula

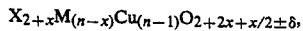

wherein n is an integer greater than 3, x is p/q (p and q are positive integers, with p<q), and $0 \leq \delta \leq 0.5$. X and M are selected in the same way as for the 80 K. compound. The integer n defines the number of M planes and Cu-planes that are present between a pair of Bi-O double planes. We expect that typically n is at most 8, and more likely 4, 5, or 6. The nominal value of x is related to the presence of a superlattice in which Bi occupies M-sites. Exemplary nominal values of x are 1/10, 1/5, 1/4, 2/5.

Materials according to the invention can be produced by a process that closely resembles the known process for producing powder of the 1-2-3 compound. One significant difference is related to the observed stability of the inventive material with regard to oxygen loss at sintering temperatures. Due to the greater stability of the inventive materials it will frequently not be necessary to subject the crystallized (and/or sintered) material to an oxygenation treatment. This clearly has significant implications for the fabrication of clad superconductive bodies, e.g., normal metal-clad superconductive wire and tape.

We have also made the unexpected discovery that superconductive bodies produced from our 84 K. material were relatively ductile, in contradistinction from the prior art high T$_c$ superconductors, which are all relatively brittle. We expect, based on similarity of crystal structure, that the other inventive phases will result in similarly ductile material. Thus, a body (e.g., a wire) made from the inventive material will be able to withstand more severe deformations (e.g., bending) than a similarly configured prior art high T$_c$ superconductor body is able to withstand without significant detrimental effect on its current-carrying ability and/or other properties.

DETAILED DESCRIPTION

Figure 1:
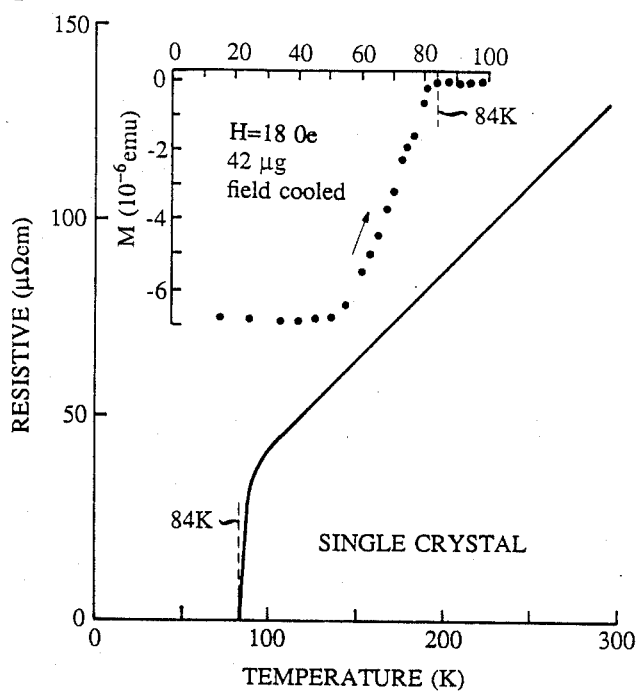
FIG. 1 shows data on resistivity and magnetization of a sample of material according to the invention (80 K. phase)

FIG. 1 present the temperature dependent resistivity and magnetization for single crystals of Bi$_{2.2}$Sr$_2$Ca$_{0.8}$Cu$_2$O$_8$. Resistivity was measured in the a-b plane on a single crystal in the van der Pauw-Price configuration which geometrically averages anisotropy in the plane. The room temperature resistivity is 130 $\mu\Omega$-cm, and decreases linearly with temperature as in the other two classes of copper oxide based superconducting materials. The resistivity is substantially lower than for Ba$_2$YCu$_3$O$_7$. The current density used for the measurement was approximately 200 Acm$^{-2}$. The transition from the superconducting to normal state begins at 84 K. and is roughly 90% complete at 90 K. The gradual curvature above 90 K. is tentatively ascribed to fluctuation conductivity. The dc magnetization, measured on a single crystal in a SQUID magnetometer (S.H.E. 905), is shown in the inset to the figure. The samples were slowly cooled in a field of 18 Oe applied parallel to the planes with the data taken during warm-up. The signal corresponds to 70% of the value expected for a full Meissner effect, thus confirming bulk superconductivity with a $T_c$ of 84 K.

Figure 2:
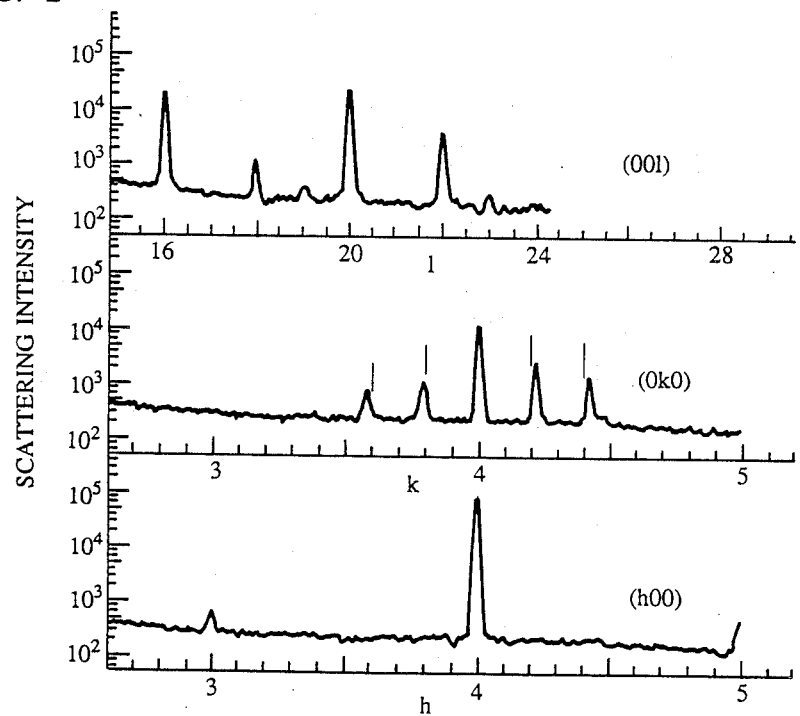
FIG. 2 shows X-ray scattering intensities.
Figure 3:
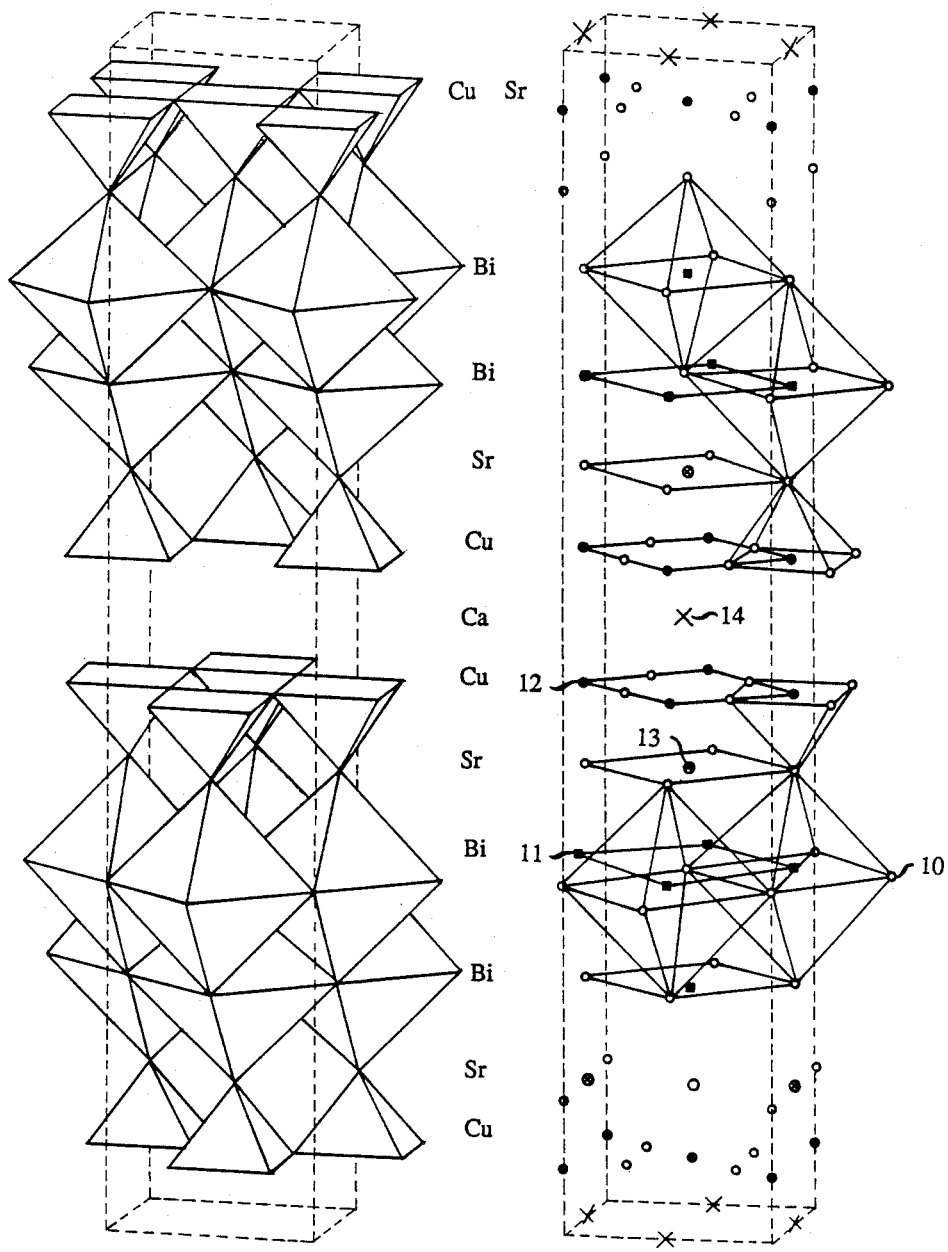
FIG. 3 schematically depicts the nominal crystal structure of the 80 K. phase.

The unit cell of the above material was determined to be orthorhombic with lattice parameters of $5.414 \times 5.418 \times 30.89$ Å and pseudosymmetry Immm. Scans with resolution of 0.04 Å$^{-1}$ FWHM along each of the principal directions of the crystal shown in FIG. 2 indicate a prominent superlattice along [0k0] giving five-fold increase of the unit cell in that direction. The absence of extra peaks along [h00] shows that there is little (a,b) twinning associated with the superlattice. The superlattice peaks are instrumentally narrow along [0k0] with an intensity that is generally less than 10% of the subcell peak intensity. The structure (without the superlattice) is illustrated in FIG. 3, wherein symbol 10 indicates an oxygen atom, 11 a Bi atom, 12 a Cu atom, 13 a Sr atom, and 14 a Ca atom. The structure as shown has an ideal formula of $Bi_2Sr_2CaCu_2O_8$ and is closely related to the Aurivillius phases. Each of the cations in the idealized cell is on a distinct crystallographic site. However, it is clear that there is greater electron density on the Ca site. The most striking feature of the structure is the presence of infinite $[CuO_2]_\infty$ planes separated by Ca, reminiscent of the same way that the planes of $Ba_2YCu_3O_7$ are separated by Y. A unique feature distinguishes the observed Bi layers from those in the Aurivillius phases; in this phase they form a double layer of edge-shared octahedra rather than infinite $[Bi_2O_2]^{2+}$ layers. The edge shared bismuth layers may be thought of as arising by occupation by Bi of some of the Ti sites in the Aurivillius type $Bi_4Ti_3O_{12}$ structure. The Bi bonding and total geometry is highly unusual. The Bi coordination is basically octahedral, with 6 nearly equal distances to oxygen, at 2.4 Å. Additionally, an oxygen layer is vacant allowing collapse of the $[Bi_2O_2]$ layers.

The ideal formula from the crystallographic subcell of $Bi_2CaSr_2Cu_2O_8$ requires $Cu^{2+}$ and $Bi^{3+}$ for the formal valence of the variable oxidation state ions. However, based on the observed metallic conductivity and superconductivity we postulate that either Bi:Sr:Ca is variable or that the superlattice is responsible for the oxidation. The composition determined by microanalysis is typically slightly different from the ideal, and we have observed some variations in composition from grain to grain in ceramic preparations. However, formal oxidation of the sample requires either an increased alkaline earth to Bi ratio or increased oxygen content. We have noted only very weak oxygen stoichiometry variations on heating polycrystalline material to 800° C. in oxygen gas by thermogravimetry, with little effect on $T_c$. The oxygen stoichometry measured by $H_2$ reduction on a single phase cermaic sample gave $Bi_{2.2}Sr_{1.7}Ca_{1.1}Cu_2O_{8.2}$, formally giving $Cu^{2.1+}$. The atomic arrangement of the superlattice is not yet known in detail, but there is clear indication that additional electron density is present on the Ca site and possibly at the vacant oxygen sites in that layer. Thus the superlattice is likely to be due to the presence and ordering of Sr or Bi on the Ca site with oxygen incorporation to complete its coordination sphere. The electron density at the Ca site is approximately 34 electrons which corresponds to a $\approx 4:1$ ratio of Ca to Bi and correlates with the superlattice along b. The superlattice observed in the exemplary sample is close to a 5x superlattice, but is clearly different. Extensive edge sharing as found in the bismuth layer causes considerable strain and is generally relieved by buckling. The super cell may be caused by such strain. The anisotropic temperature parameter of Bi shows an anonymously large component along b indicating possible distortions. The copper-oxygen coordination polyhedron is a square pyramid of similar geometry to that found in $Ba_2YCu_3O_7$ but with an important difference in the bond length of Cu to the apical oxygen. The inplane Cu-O distances in $Bi_2Sr_2CaCu_2O_8$ are 1.875 Å, and the apical oxygen is at 2.05 Å, considerably shorter than that for either $Ba_2YCu_3O_7$ (2.3 Å) or $(LaSr)_2CuO_4$ (2.4 Å). This can be expected to considerably influence the charge distribution in the Cu-O planes, the shorter bond distance likely being due to the weakly electropositive character of Bi when compared to the the rare earth or alkaline earth atoms which share the apical oxygen with Cu in the 40 K. and 90 K. structure types.

The Bi coordination geometry is highly unusual. Although small displacive distortions may be present (awaiting determination of the full supercell structure), the Bi coordination is basically octahedral, with 6 nearly equal distances to oxygen, at 2.4 Å. This coordination is distinctly different from that of the Aurivelius phases, where the influence of a lone-pair is apparent. The total geometry is that of a highly covalently bonded Bi-O layer, evidenced by the extensive edge sharing. The Bi-O double layer is related to but different from that of the Aurivelus phases.

Figure 4:
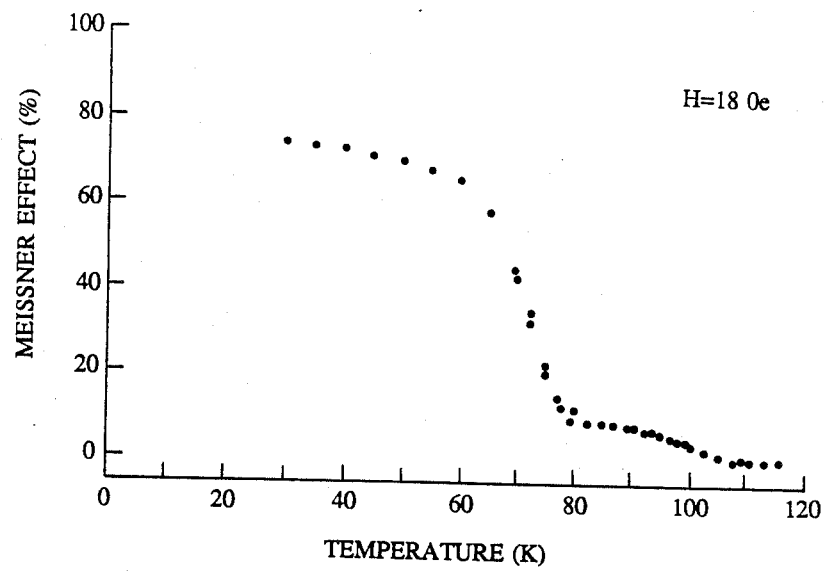
FIG. 4 shows data on the Meissner effect in two samples of material according to the invention.

Substitution of Bi with lead in the 84 K. phase have yielded considerable improvement in $T_c$. FIG. 4 shows magnetization data for a multiphase lead substituted sample that shows a $\approx 10\%$ Meissner effect with a $T_c$ of 107 K.

Figure 11:
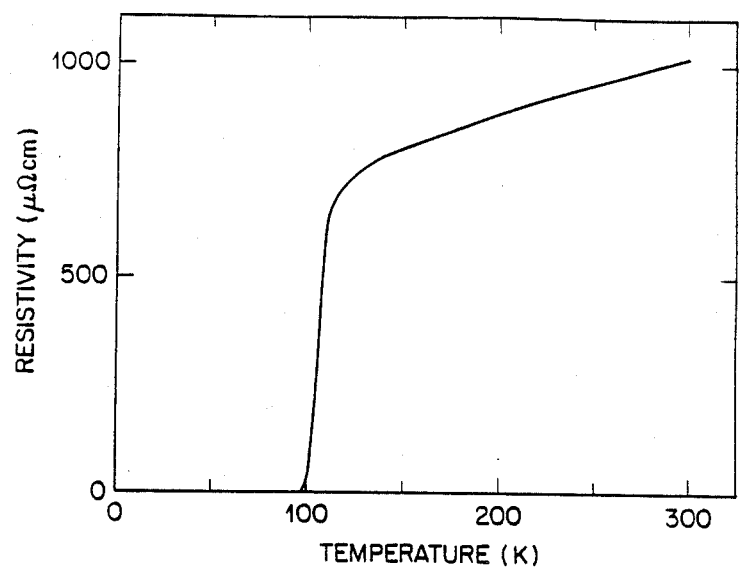
FIGS. 11 and 12 show the resistivity vs. temperature and magnetization vs. temperature, respectively, for an examplary Pb-substituted material according to the invention.
Figure 12:
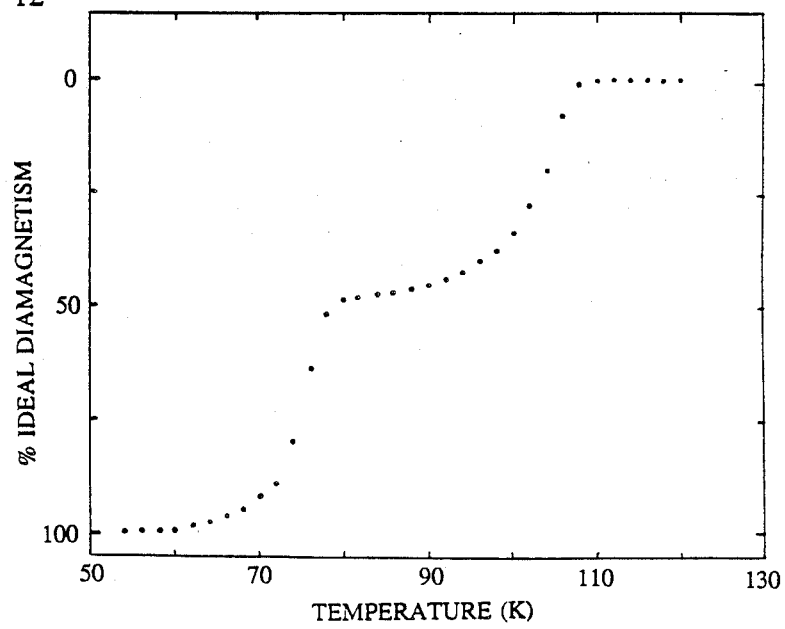

FIG. 11 shows resistivity vs. temperature for exemplary Pb-substituted material according to the inventive $(Bi_{1.6}Pb_{0.4}Sr_{1.5}Ca_{1.5}Cu_2O_{8\pm\delta})$ that exhibits advantageously high $T_c$ (R=o) of 97 K., and FIG. 12 shows magnetization vs. temperature for the material.

We have found that the structure of the 80 K. compound can be modified, in accordance with the general nominal formula $X_{2+x}M_{(n-x)}Cu_{(n-1)}O_{2+2n+x/2\pm\delta}$. The modifications result in added layers of M and Cu between the Bi-O double layers and are expected to result in one or more phases of stable high $T_c$ superconductive material.

All of the inventive phases have layered perovskite-like crystal structure, and the existence of relatively weak bonding between at least some layers may be the cause of the observed relatively high ductility of the inventive materials. It will be appreciated that by "perovskite-like" we mean not only the prototypical, truly cubic structure, but very significantly distortions therefrom.

Material specification in accordance with the invention depends upon the nature of the intended use. For power transmission, or any other current-carrying application, it is required that there be a continuous superconducting path. For detector and other device use (e.g., Josephson junction devices) in which tunneling might be permitted or even required, it is necessary only that there be sufficient superconducting phase to satisfy such use.

For many purposes, it is an advantage of the invention that fabrication of superconducting elements may utilize standard ceramic processing.

Appropriate starting materials are mixtures of metallic oxides, hydroxides, carbonates, hydrates, oxalates or other reactive precursors in the appropriate ratio to obtain the desired final composition. Starting material may be produced by wet or dry mixing, by co-precipitation of materials from solution, or by any other method which results in intimate mixture of reactive particles.

Mixtures of starting materials can be fired in air, oxygen or other non-reducing ambient at temperatures sufficient to facilitate chemical reaction between constituents and to begin formation of the desired phase. Firing temperatures as noted are composition-dependent so that choice of temperature may radically affect $T_c$ for certain compositions. Typically, temperatures are between approximately 700° and 950° C. for times of between a few hours and several days until the desired phase is either fully or partially produced. The "calcined" material is then formed into the ceramic body of desired shape by standard ceramic processing techniques such as hot or cold pressing, extrusion, slipcasting, or other such technique appropriate to the geometry of the desired (green body) object.

The material in final form is fired at a temperature sufficiently high to complete chemical reaction of components ("reactive sintering") if not accomplished previously and for densification. This "sintering" is conducted so as to reduce voids to the point where the density of the ceramic body is sufficient to allow obtaining favorable electrical and mechanical properties. Material fired in air may have acceptable superconducting properties.

While the description above is important for many purposes, material preparation may take other forms. An alternative is preparation of thin films for Josephson junction and other devices. Workers in the field know of many film-forming procedures, e.g., magnetron sputtering, diode sputtering, reactive ion sputtering, ion-beam sputtering and other thin film deposition techniques including evaporation. "Conductor" structures may take on the form of continuous strands, however produced. Initial formation may utilize techniques as applied to other brittle glass-like material. In this approach, the structure reverts to one that is crystalline before attainment of superconductivity. One technique which has been applied to other brittle superconductors entails extrusion within a protective sheathing of copper or other ductile material.

Since the material is oxidic another approach may entail formation of any alloy of the designated metals followed by oxidation.

Materials according to the invention are expected to be useful in most applications suitable for prior art superconductors and, due to their relatively high ductility and other advantageous properties, also in some applications for which the prior art high $T_c$ superconductors are not well suited. Exemplary of likely applications are FIGS. 5-10.

Figure 5:
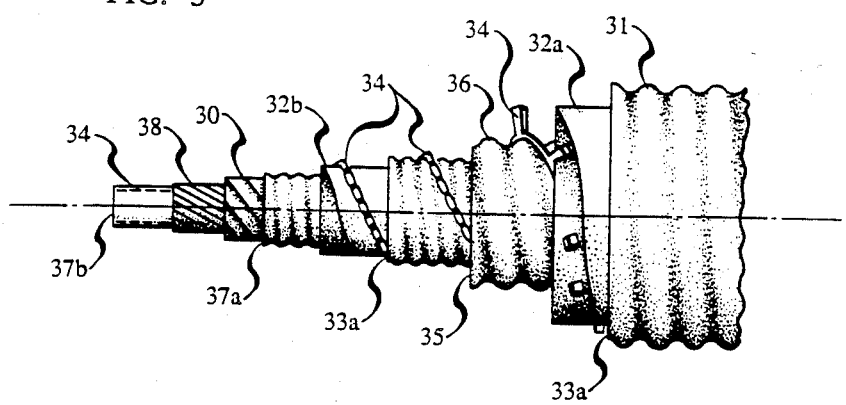
FIGS. 5-10 schematically depict exemplary articles of manufacture which can advantageously comprise superconductive elements according to the invention.
Figure 6:
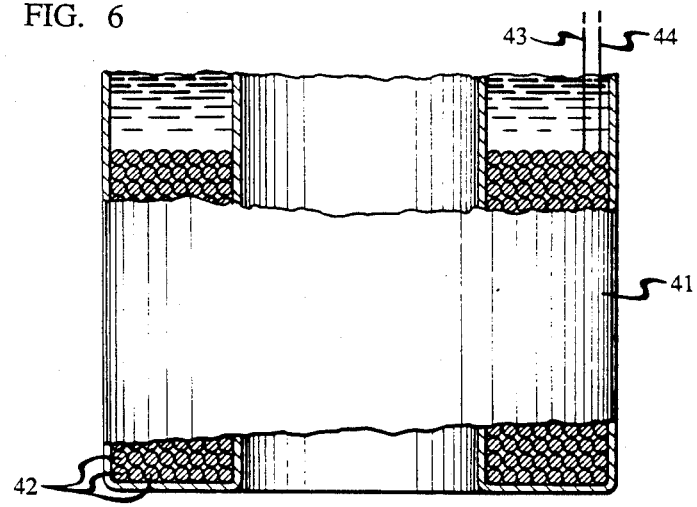
Figure 7:
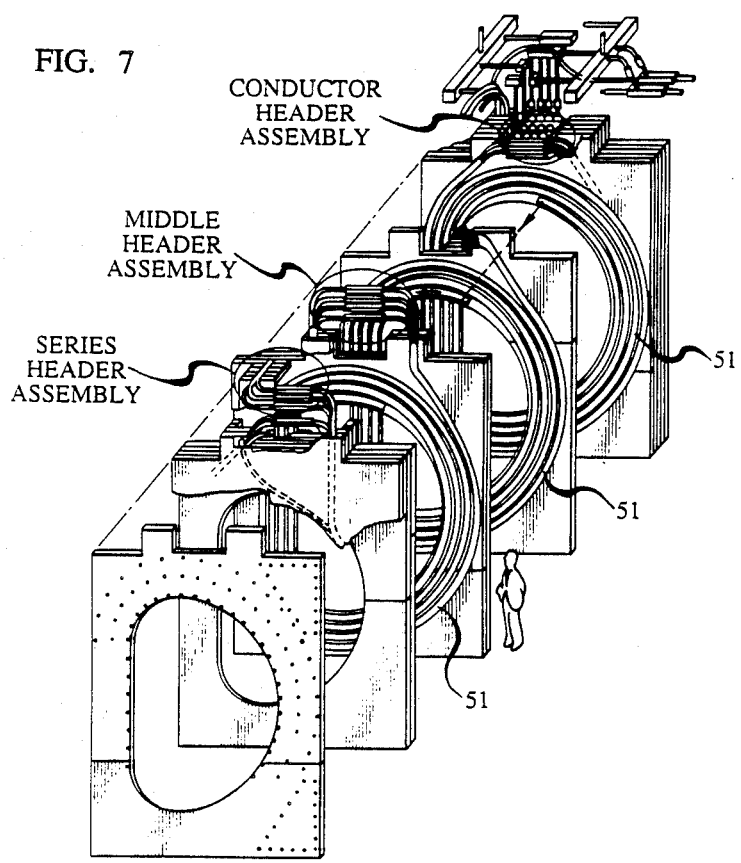

In FIG. 5, the structure shown is described in G. Bogner, "Large Scale Applications of Superconductivity", in *Superconductor Application: SQUIDS and MACHINES*, B. B. Schwartz and S. Foner, eds. (Plenum Press, New York, 1977). Briefly, the structure depicted consists of an outer sheathing 31, thermal insulation layers 32a and 32b, evacuated annular regions 33a and 33b, spacers 34, nitrogen-filled annular region 35, heat shield 36, and coolant regions 37a and 37b (it is a feature of the inventive structure that coolant may consist of liquid nitrogen in contradistinction with the liquid helium or hydrogen required of earlier structures). Element 38 is a superconductor material in accordance with the invention. FIG. 6 shows an annular cryostat 41 filled with liquid nitrogen and containing turns 42 of a material herein. Terminal leads 43 and 44 are shown emerging from the coil. The magnetic test structure of FIG. 7 is described in R. A. Hein and D. U. Gubser, "Applications in the United States", in *Superconductor Materials Science: Metallurgy, Fabrication, and Applications*, S. Foner and B. B. Schwartz, eds., (Phenum Press, New York, 1981). The superconducting element shown as windings 51 are made of a material herein. The structure is considered exemplary of those expected to find broad-scale use for containment of fusion reaction.

Figure 8:
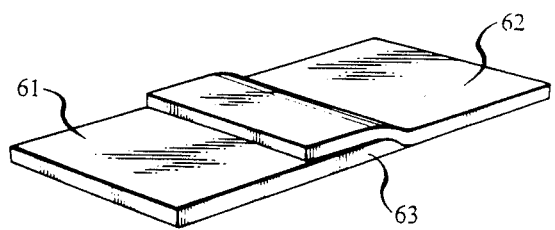

FIG. 8 schematically depicts a Josephson junction device. The structure consists of two superconducting layers 61 and 62 separated by a tunneling barrier 63. Use of material of the invention (not necessarily identical) for 61 and 64 permit usual Josephson action at higher temperatures than previously permitted. Josephson junction devices are described in M. R. Beasley and C. J. Kircher "Josephson Junction Electronics: Materials Issues and Fabrication Techniques", ibid.

Figure 9:
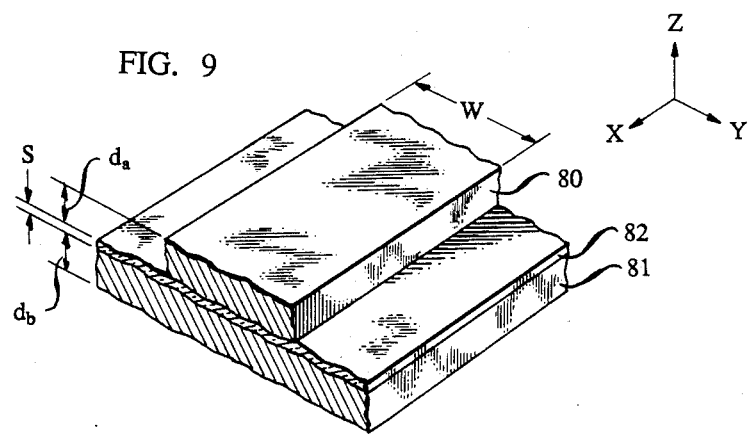

FIG. 9 is a perspective view of a section of superconducting stripline. Structures of the type depicted usefully serve as interconnections (rather than many-kilometer long distance transmission). It is structures of this type that are expected to permit operation at significantly increased speed of present commercial apparatus. The structure which is depicted in *J. Appl. Phys.*, Vol. 49, No. 1, page 308, January 1978, consists of superconducting strip 80 insulated from superconducting groundplane 81 by dielectric layer 82. Considerations entailed in dimensioning the structure depend upon intended use and are generally described in the *J. Appl. Phys.* reference.

Figure 10:
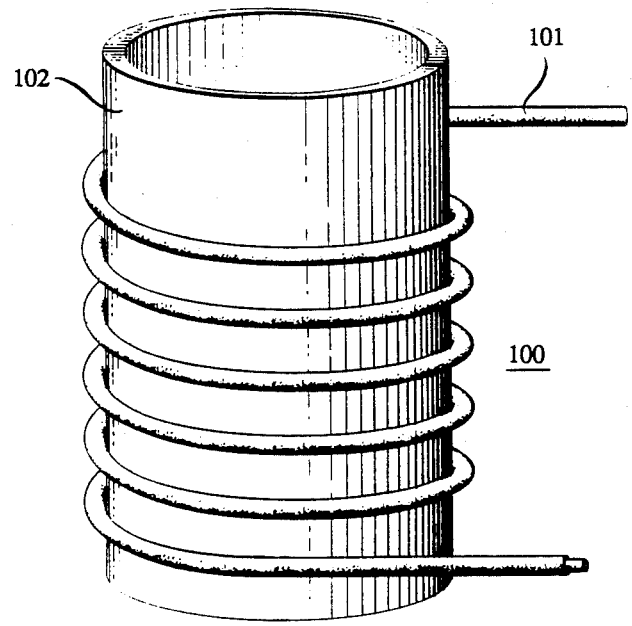

FIG. 10 schematically depicts a superconductive magnet 100 comprising clad superconductive wire according to the invention 101 wound on mandrel 102.

EXAMPLES

Example 1

Commercially obtained powders of $Bi_2O_3$, $Sr(NO_3)_2$, $Ca(NO_3)_2.4H_2O$, and $CuO$ were mixed in molar ration 1.1:2:0.8:2, the resulting mixture was heated in air in an alumina crucible to 500° C., then slowly to 840° C., and maintained at that temperature for about 12 hours. The thus calcined material was cooled in air, ground by conventional means, pressed into pellet form (also by conventional means), and the pellets heated in air to 860° C., maintained at that temperature for 5 hours, and cooled to room temperature in air. The thus produced sintered material had $T_c$ (R=0) of 84 K. and 70% relative diamagnetism at 4.2 K. (compared to Pb). The material had nominal composition $Bi_{2.2}Sr_2Ca_{0.8}Cu_2O_8$, and crystallites of the material showed a superlattice, with repeat distance of about 4.76.

Example 2

Material is prepared substantially as in Example 1, except that the molar ratio was 1.1:3.9:1:3. The resulting material has nominal composition corresponding to n=4 in the general formula.

Example 3

A single crystal of nominal composition as described in Example 1 (grown from molten Na-Cl flux at 850° C.) had a $T_c$ of 84 K. and a superlattice spacing of 4.76b.

Example 4

A single crystal, prepared as described in Example 3, showed a few % superconductivity above 100 K., with the remainder superconductivity at 84 K. This crystal showed a 6.25b supercell, in addition to the 4.67b superlattice. We believe that the higher $T_c$ portion of the sample is associated with the longer superlattice, and believe that the association between higher $T_c$ and longer superlattice spacing is a general one.

Example 5

A pellet of nominal composition $Bi_{1.6}Pb_4Sr_{1.5}Ca_{1.5}Cu_2O_x$ ($x \sim 8$) was produced substantially as described in Example 1, except that commercially obtained PbO powder was mixed with the previously mentioned powders in stoichiometric ratio, and in that the pellet was maintained at 860° C. in air for 42 hours. The resistivity of the pellet as a function of temperature is shown in FIG. 11, and the magnetization in FIG. 12. The pellet consists substantially of a chemical compound of structure as shown in FIG. 3. The large amount of diamagnetism (with onset at about 108 K.) observed in the sample indicates that the active chemical compound has the basic structure shown in FIG. 3, with the Pb-substitution believed to favor the formation of the "108 K." phase.

Example 6

A pellet of noiminal composition $Bi_{1.4}Pb_{0.6}Sr_{1.5}Ca_{1.5}Cu_2O_x$ ($x \sim 8$) was produced substantially as described in Example 5. The resistivity and magnetization were substantially as shown in FIGS. 11 and 12, respectively. The structure was substantially as in the material of Example 5.

Example 7

A pellet was produced substantially as described in Example 5 except that the Sr/Ca ratio was 2. The material has the basic structure indicated in FIG. 3, and has a temperature $T_c > 77$ K.

What is claimed is:

1. A superconductive element comprising an effective amount of material nominally of perovskite structure and of nominal composition $X_{2+x}M_{3-x}Cu_2O_{8\pm\delta}$, where X is Bi and Pb, M is Sr and Ca, x is equal to or greater than 0 and less than about 0.3, $\delta$ is greater than about 0 and less than about 0.5, the Pb/Bi ratio is between about 0.2 and about 0.5, the Sr/Ca ratio is between about 0.5 and about 2, and the element manifesting a transition temperature $T_c(R=o)$ of at least 77 K.

2. Superconductive element of claim 1, wherein the Sr/Ca ratio is between about 0.75 and 1.25.

* * * * *